United States Patent
Barringer et al.

(10) Patent No.: US 6,262,582 B1
(45) Date of Patent: Jul. 17, 2001

(54) MECHANICAL FIXTURE FOR HOLDING ELECTRONIC DEVICES UNDER TEST SHOWING ADJUSTMENTS IN MULTIPLE DEGREES OF FREEDOM

(75) Inventors: Dennis R. Barringer, Wallkill, NY (US); Mark R. LaForce, Essex Junction, VT (US); Mark A. Marnell, Kingston, NY (US); Donald W. Porter, Highland, NY (US); Roger R. Schmidt, Poughkeepsie, NY (US); Wade H. White, Hyde Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/418,655

(22) Filed: Oct. 15, 1999

(51) Int. Cl.$^7$ .............................. G01R 31/02; B23Q 1/00; B25B 1/00
(52) U.S. Cl. .................... 324/755; 269/50; 269/254 CS; 269/289 R; 269/900; 269/903
(58) Field of Search .............................. 324/755; 269/903, 269/289 R, 900, 254 CS, 56

(56) References Cited

U.S. PATENT DOCUMENTS

| | | | |
|---|---|---|---|
| 4,688,870 | * | 8/1987 | Egawa et al. ........................ 439/331 |
| 4,809,917 | * | 3/1989 | Tsuchiya ............................ 242/439.5 |
| 5,099,393 | * | 3/1992 | Bentlage et al. ..................... 361/785 |
| 5,106,451 | * | 4/1992 | Kan et al. ......................... 156/583.3 |
| 5,148,103 | | 9/1992 | Pasiecznik, Jr. . |
| 5,177,439 | * | 1/1993 | Liu et al. .............................. 324/754 |
| 5,408,190 | * | 4/1995 | Wood et al. ......................... 324/765 |
| 5,416,429 | | 5/1995 | McQuade et al. . |
| 5,506,512 | | 4/1996 | Tozawa et al. . |
| 5,584,711 | * | 12/1996 | Arai et al. ............................. 439/326 |
| 5,623,214 | | 4/1997 | Pasiecznik, Jr. . |
| 5,672,977 | | 9/1997 | Yamada . |
| 5,804,983 | | 9/1998 | Nakajima et al. . |
| 5,828,225 | | 10/1998 | Obikane et al. . |
| 5,834,842 | * | 11/1998 | Majumdar et al. .................. 257/718 |
| 5,861,759 | | 1/1999 | Bialobrodski et al. . |
| 5,892,366 | | 4/1999 | Byers . |
| 5,897,108 | * | 4/1999 | Gordon et al. ......................... 269/50 |

* cited by examiner

Primary Examiner—Glenn W. Brown
Assistant Examiner—Wasseem H. Hamdan
(74) Attorney, Agent, or Firm—Floyd A. Gonzalez; Jon A. Gibbons; Fleit, Kain, Gibbons, Gutman & Bongini P.L.

(57) ABSTRACT

A fixture to hold an electronic substrate having probe areas on a top surface. The top surface of the electronic substrate is left open to provide a maximum area to couple interconnect wires for a device under test. In addition, a bottom surface of the substrate is left open to provide a maximum area to couple with a probe card in one embodiment, or a test head in another embodiment. This open bottom and open top minimize the mechanical interference with electrical connections. The substrate is planarized to a frame by one or more clamps that are attached to the frame. The clamps provide adjustment of the pressure down on the substrate in a Z-axis direction which is normal to the top surface of the substrate for providing a good connection with a planar card. In addition, the clamps provide adjustment in the an X-Y plane parallel to the frame and rotational correction about the Z-axis.

18 Claims, 4 Drawing Sheets

200

US 6,262,582 B1

MECHANICAL FIXTURE FOR HOLDING ELECTRONIC DEVICES UNDER TEST SHOWING ADJUSTMENTS IN MULTIPLE DEGREES OF FREEDOM

CROSS-REFERENCE TO RELATED APPLICATIONS

Not Applicable

BACKGROUND OF THE INVENTION

1. Field of the Invention

The invention relates to the mechanical fixtures for holding electronic devices under test, and more particularly the present invention relates to a mechanical fixture that can adjust the device being held in X, Y, Z and theta (Θ) direction while accommodating several hundred of pounds of force in the Z-direction.

2. Description of the Related Art

The density of semiconductor electronics increases every year. One known postulate in the field of semiconductor manufacturing is Moore's Law which predicts every 18 months the density of semiconductor circuitry doubles. Besides the obvious decrease in size for semiconductor devices, the number of transistors or gates that can be offered in a given die size continues to grow. This increase density allows for more complex circuitry to be eveloped. And although the increase in semiconductor density is very desirable it is not without its shortcomings.

One shortcoming is the increase in the density of input and output (I/O) points for a given circuit. It is not uncommon for highly density package to have hundreds and even thousands of I/O points. Besides providing communication with other devices, these I/O points provide an interface back to the circuitry for testing.

In order to ensure the devices on a semiconductor module function properly, testing on the semiconductor module, prior to dicing is often performed. Testing is typically done by applying signals across a wide frequency range to preselected inputs to see if a predetermined output signal is generated. Using various signal frequencies on the inputs, i.e., from D.C. (i.e., zero frequency) for the determination of simple breaks to high frequency A/C signals to determination of high impedance breaks, the circuitry on the devices can be tested.

Probing is one type of commonly used testing for semiconductors. Probing is where one or more probe inputs are directed to inputs of the device I/O and one or more sets of probe outputs are directed to outputs of the device I/O. Typically the probing is done with mechanical probes that are directed using servo systems to predefined locations on the semiconductor device. However, as the density of the I/O increases, the physical mechanical limitations of the probes become a limiting factor. For instance, in some highly integrated devices it is not uncommon to have over 1800 points of I/O in a 2 inch by 2 inch square area. The accurate placement of probes in an adjacent set of I/O points becomes problematic. To overcome this physical limitation, designers of test equipment use intermediate probe cards that have interconnects such as spring loaded pins, called pogo pins, that contact the I/O on the device. These probe cards which are larger than the device being tested provide an area that is larger for the probes to contact. However, as the density of the semiconductors devices increases, the density of the probe card I/O points that contact the I/O on the device must also increase.

In fact for very dense integrated circuits, it is common to have several levels of intermediate cards that physically fan out the I/O from the semiconductor device under test to the probe areas. Several levels of intermediate cards are often necessary to provide the proper mechanical fan out of the I/O points of the wafer being tested to the probe areas. The cards and substrates used to physically fan out the I/O to a larger probe area are often referred to as "space transformers." Turning now to FIG. 1, shown is an elevational view 100 of a semiconductor wafer 102 having a plurality of semiconductor devices (not shown) with I/O points (not shown). Each I/O point has an interconnect wire 104 (not shown to scale) from the wafer 102 electrically attached to the topside 110 of substrate 106. The underside 114 of the substrate 106 provides signals to the semiconductor wafer 102 for input such as power, ground and other operating signals. A probe card 116 provides an interposer of electronic signals from a test head 118 up through the underside of the substrate 106. The test head 118 consists of a series of spring loaded pins (not shown), called pogo pins, that mate with the probe card 116. The force necessary to hold the substrate 106 to the probe card 116 onto pogo pins 118 to ensure a good electrical connection can be very large. In fact, it may be common for the force to exceed 500 pounds in cases where there are several hundred pogo pins to mate against securely.

The substrate 106 has probe area 114 which allows a mechanical probe to read signals that are being applied to one or more devices on the semiconductor wafer 102 that is being delivered signals from the test head 118. This allows the testing of one or more devices simultaneously on the semiconductor wafer 118.

The alignment of the substrate 106 to the probe card 116 and test head 118 is critical. In fact, all the directions (i.e., X, Y, Z, and Θ) relative to the substrate 106 and the card 116 must be compensated.

Accordingly, a need exists for a mechanism to hold the substrate 106 securely under several hundred pounds of pressure in the Z-direction, while being compliant in the X, Y, Z, and Θ) directions.

Still, another problem that exists for a mechanism to hold the substrate 106 securely in place without sacrificing any of the underside area 114 of the substrate 106 being mounted on the probe cards 116, so as to maximize the area for contact pogo pins. The area for the topside 110 of the substrate 106 is Key as well. The topside 110 area needs to be maximized for connections with the Wafer 102. Accordingly, a need exists for a mechanism to hold the substrate 106 in a compliant manner without giving up any underside area 114 or topside 110 real-estate on the substrate 106.

SUMMARY OF THE INVENTION

Briefly, in accordance with the present invention, described is a fixture to hold an electronic substrate having probe areas on a top surface. The top surface of the electronic substrate is left open to provide a maximum area to couple interconnect wires for a device under test. In addition, a bottom surface of the substrate is left open to provide a maximum area to couple with a probe card in one embodiment, or a test head in another embodiment. This open bottom and open top minimize the mechanical interference with electrical connections.

The substrate is planarized to a frame by one or more clamps that are attached to the frame. The clamps provide adjustment of the pressure down on the substrate in a Z-axis direction which is normal to the top surface of the substrate for providing a good connection with a planar card. In addition, the clamps provide adjustment in an X-Y plane parallel to the frame and rotational correction about the Z-axis.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention will be apparent from the following detailed description taken inconjunction, with the accompanying drawings.

DETAILED DESCRIPTION OF AN EMBODIMENT

However, it should be understood that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and vice versa with no loss of generality.

Figure 1:
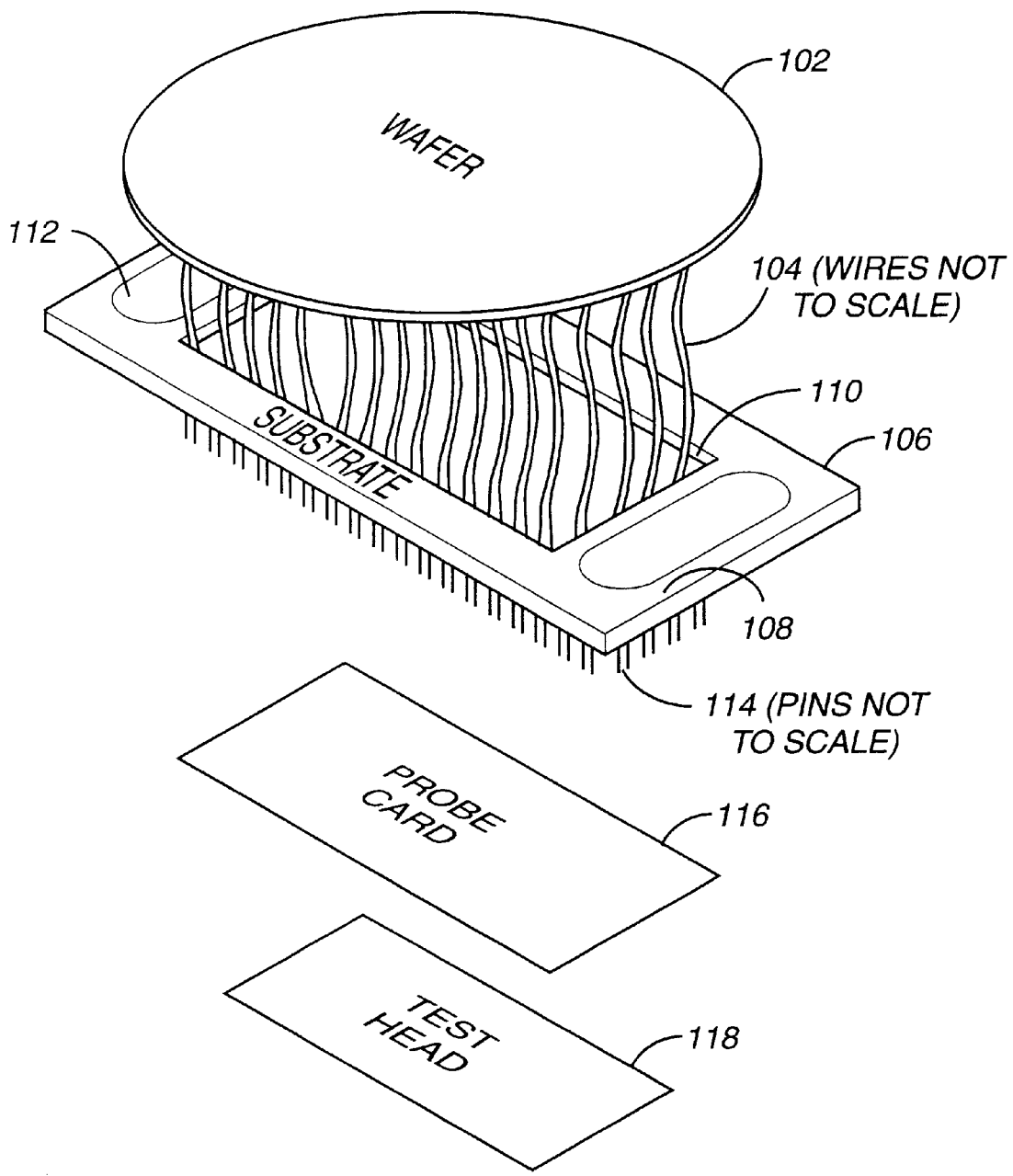
FIG. 1 is an elevational view of a semiconductor device with I/O points being brought out for testing using probing on a substrate.

Referring now in more detail to the drawings in which like numerals refer to like parts throughout several views, as described in FIG. 1, the device (not shown) to be tested on a semiconductor wafer 102 is electrically coupled via wires 104 to a substrate 106 with probe areas 118 fan out electrical signals from the wafer I/O. The substrate 106 is a multilayer substrate, such as a ceramic substrate with one or more layers of metalization. The substrate 106 has a contact area 110 for electrically coupling with a wafer (not shown) via a plurality of wires 104. In order to provide the perspective of one embodiment of this invention, these wires 104 are very small and can be 0.0020 inch thick in or even smaller. The substrate is approximately 5 inches by 2.5 inches with an active area 110 of about 2.5 inches by 2.5 inches. The underside 114 the substrate, has CCI interconnects (not shown) attached thereto. These interconnects electrically couple with the probe card 116 when compressed together.

Figure 2:
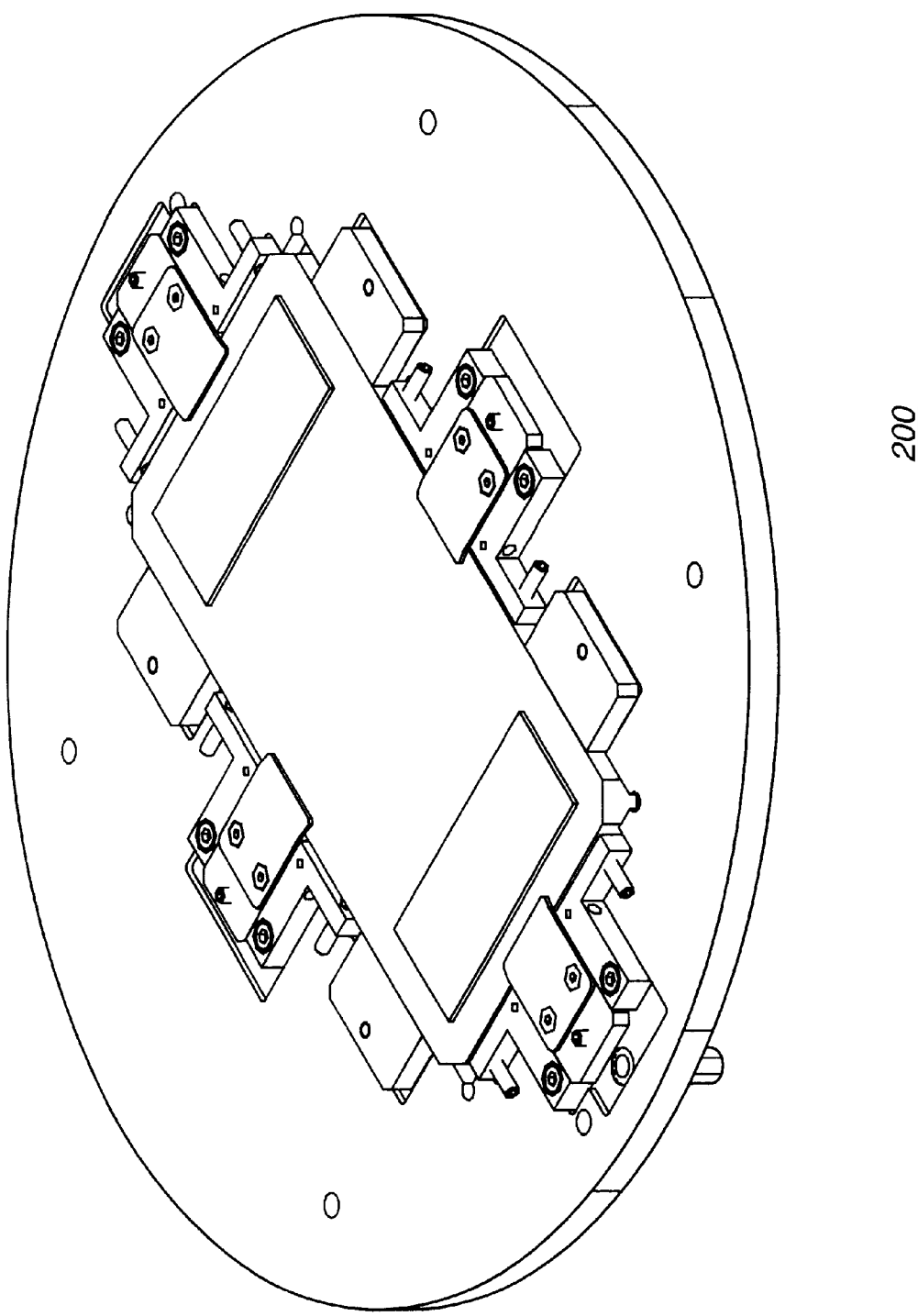
FIG. 2 is an elevational view of a test fixture with clamps holding the substrate according to the present invention.
Figure 3:
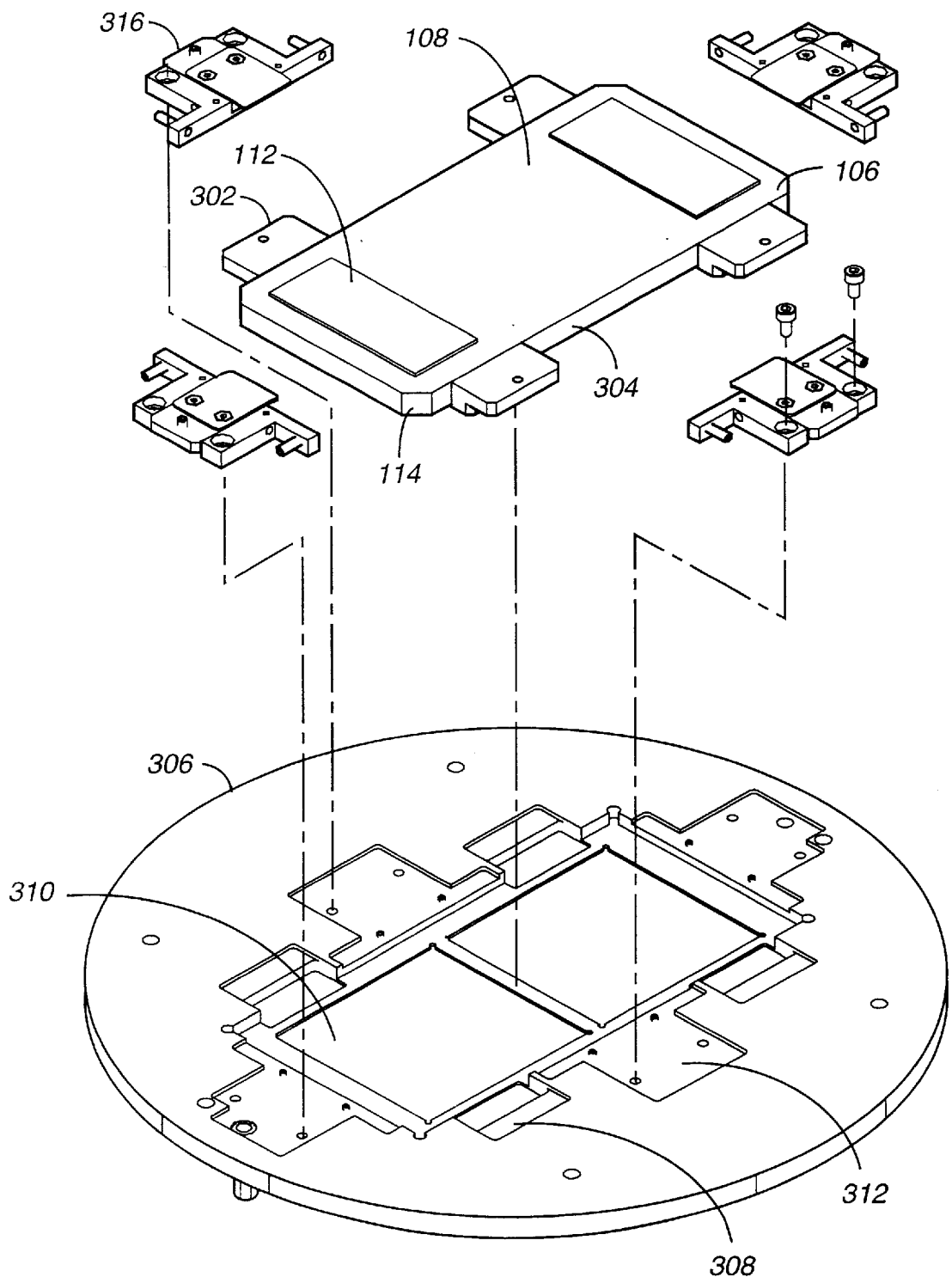
FIG. 3 is an elevational explosion view of the test fixture of FIG. 2, according to the present invention.

Turning now to FIG. 2, shown is an elevational view 200 of a test fixture with clamps holding the substrate 106 according to the present invention. Correspondingly, FIG. 3 is an elevational explosion view 300 of the test fixture of FIG. 2, according to the present invention. The substrate 106 has a set of feet 302 affixed to the edge 304 of the substrate 106. The feet 302 can be made from any material where the thermal coefficient of expansion is the same as the substrate 106, such as the metal known as InVar The feet 302 are outbound or off the topside 108 and underside 114 of the substrate thereby eliminating any reduction or interference with the probing areas 118, the contact area 110 and the underside 114, thereby maximizing the use of the areas for electrical interconnects to and from the wafer and the probe card 118. A rigid frame 306, typically made out of metal, has specially formed recesses 308 for receiving the feet 302 in order to coarsely position the substrates with the frame 306. Two openings in the frame of about 2.5 inches by 2.5 inches accommodate probe cards 116there through to enable contact via pogo pins (not shown) or other contact devices with the underside 114 of the substrate 106.

Figure 4:
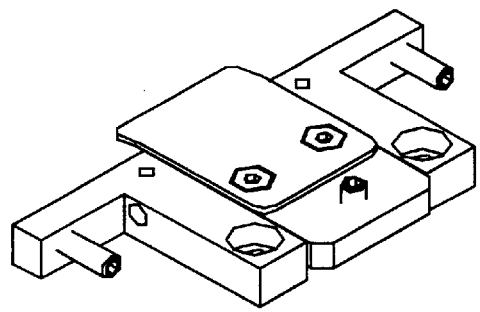
FIG. 4 is an elevational view of a clamp of FIG. 2 according to the present invention.
Figure 5:
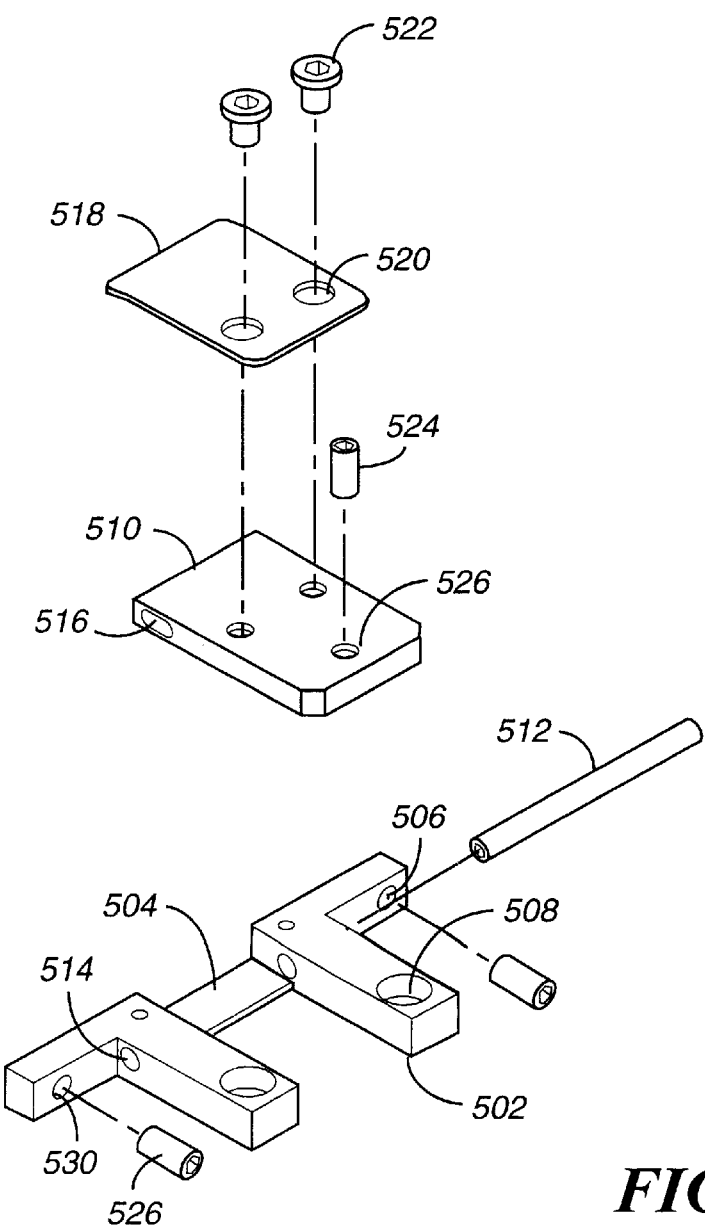
FIG. 5 is an elevational explosion view of a clamp of FIG. 5 according to the present invention.

A set of clamps 316 are fastened to the frame 306 with set screws 314. The frame has a recess 312 formed to coarsely align the clamps 316 within the frame. FIG. 4 is an elevational view of a clamp 316 and FIG. 5 is a corresponding elevational explosion view of a clamp 316, according to the present invention. The clamp has a set of two L-shaped members connected by a pivot bar 504 as shown in FIG. 5. An adjustment bar 510 is pivotally mounted on the pivot bar 504 with a dowel pin 512. The dowel pin 512 is inserted through an opening 514 in each L-shaped member and an opening 516 in pivot bar 504. A spring clamp 518 is attached to the pivot bar 504 with fasteners 522. The spring clamp 518 protrudes over the pivot bar and engages with substrate 106. The amount of force to push down with spring clamp 518 on the topside 108 of substrate 106 is adjustable through the threaded opening 526, with a screw 524 turned thereinto, the greater the force translated through the fulcrum type set up of clamp 518 and pivot bar 504. This provides an adjustable force along a Z-axis, which is normal to the topside 108 of substrate 106. In one embodiment the screw 524 is a number 4-40 screw and all the components of clamp 316, are formed from metal including the spring clamp 518 which is stamped spring steel.

To permit adjustment in plane parallel to the frame 306, a set of screws 526 engages edge 304 of substrate 106. The adjustment of each screw allows the X-Y position of the substrate to be adjusted relative to the frame 306. In addition, by adjusting a combination of screws 526 on one or more clamps 518, the rotation of the substrate, theta (Θ) around the Z-axis can be adjusted as well.

It should be understood to those skilled in the art that the adjustment of the substrate 106 in the X, Y, Z and Θ position is achieved by using one or more clamps 518 and that the force along the Z-axis is also adjustable. According the substrate 106 is planarized to the frame 106 which can be planarized to the card 116. The clamps 518 do not interfere with the topside 108 or the bottom side 110 of the substrate 106.

Although a specific embodiment of the invention has been disclosed, it will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A clamp for holding an electronic substrate with a top side, a bottom side, and an edge, against a frame, the clamp comprising:

a pivot bar;

a substantially rectangular adjustment bar, pivotally mounted on the pivot bar;

a spring clamp mounted on top of the adjustment bar, with at least one edge protruding beyond the adjustment bar in order to engage the top side of the substrate to fasten the substrate against the frame;

means for adjusting the pivot position of the adjustment bar so as to change a force of the spring clamp holding against the substrate;

two L-shaped members each comprising a longer segment joined at a right angle with a shorter segment, the longer segment of the L-shaped members in parallel to one another, the L-shaped members being joined together by the pivot bar such that the short segments are substantially along a line, the set of L-shaped members attached to the frame; and means for separately adjusting the engaging of the shorter segment of each of the L-shaped members against the edge of the substrate so as to permit the positioning of the substrate in a plane parallel to the frame.

2. The clamp according to claim 1, wherein the means for adjusting the engaging includes the positioning of the substrate in an X-Y plane parallel to the frame and a rotation Θ about an axis normal to the frame.

3. The clamp according to claim 2, where in the means for adjusting the pivot bar provides an adjustment along a Z-axis which is normal to the frame.

4. The clamp according to claim 3, wherein the means for adjusting the engaging includes the positioning of the substrate in a plane parallel to the frame to a precision of 0.0005 inches along the X, Y, and Θ directions.

5. The clamp according to claim 1, wherein the means for adjusting the pivot bar is a set screw.

6. The clamp according to claim 1, wherein the means for adjusting the pivot bar is a bolt.

7. The clamp according to claim 1, wherein the means for separately adjusting the engaging of the shorter segment of each of the L-shaped members against the edge of the substrate so as to permit the positioning of the substrate in a plane parallel to the frame the pivot bar is a set screw.

8. The clamp according to claim 1, wherein the frame has an opening to permit the bottom side of the semiconductor substrate to electrically couple with a probe card positioned underneath the opening by maintaining a force normal to the top surface of the substrate that urges the bottom side of the substrate against a probe card.

9. The clamp according to claim 8, wherein the probe card comprises pogo pings for electrically coupling with the bottom side of the substrate.

10. The clamp according to claim 9, wherein the probe card is sandwiched between the bottom side of the substrate and a test head, so as to provide a plurality of electrical coupling therebetween.

11. The clamp according to claim 8, wherein the force normal to the top surface exceeds 100 pounds.

12. The fixture according to claim 1, wherein the force normal to and away from the frame is over 100 pounds.

13. The fixture according to claim 1, wherein the means for adjusting the position of the semiconductor substrate in a plane includes a set screw.

14. The fixture according to claim 1, wherein the means for adjusting the position of the semiconductor substrate in a direction normal to the frame includes a set screw.

15. A clamp for holding an electronic substrate with a top side, a bottom side, and an edge, against a frame, the clamp comprising:

a pivot bar;

a substantially rectangular adjustment bar, pivotally mounted on the pivot bar;

a spring clamp mounted on top of the adjustment bar, with at least one edge protruding beyond the adjustment bar in order to engage the top side of the substrate to fasten the substrate against the frame;

a first fastener coupled to the adjustment bar for adjusting the pivot position of the adjustment bar so as to change a force of the spring clamp holding against the substrate;

two L-shaped members each comprising a longer segment joined at a right angle with a shorter segment, the longer segment of the L-shaped members in parallel to one another, the L-shaped members being joined together by the pivot bar such that the short segments are substantially along a line, the set of L-shaped members attached to the frame; and a second fastener coupled to the shorter segment of one of the L-shaped members; and a third fastener coupled to the shorter segment of one of the L-shaped members;

so that each of the second and the third fastener permits separate adjustments of the shorter segment of each of the L-shaped members against the edge of the substrate so as to permit the positioning of the substrate in a plane parallel to the frame.

16. The fixture according to claim 15, wherein the force normal to and away from the frame is over 100 pounds.

17. The fixture according to claim 15, wherein the means for adjusting the position of the semiconductor substrate in a plane includes a set screw.

18. The fixture according to claim 15, wherein the means for adjusting the position of the semiconductor substrate in a direction normal to the frame includes a set screw.

* * * * *